United States Patent [19]

Ownby et al.

[11] 4,400,232

[45] Aug. 23, 1983

[54] CONTROL OF OXYGEN- AND CARBON-RELATED CRYSTAL DEFECTS IN SILICON PROCESSING

[75] Inventors: Paul D. Ownby, Rolla; Paul E. Grayson, Joplin, both of Mo.

[73] Assignee: Eagle-Picher Industries, Inc., Cincinnati, Ohio

[21] Appl. No.: 319,638

[22] Filed: Nov. 9, 1981

[51] Int. Cl.$^3$ .............................................. C30B 33/00
[52] U.S. Cl. ................................... 156/601; 423/350; 156/DIG. 89; 156/DIG. 83
[58] Field of Search .................. 156/601, 617 SD, 608, 156/DIG. 64, DIG. 89, DIG. 83; 422/246, 248, 249; 423/348, 350

[56] References Cited

U.S. PATENT DOCUMENTS

| | | | |
|---|---|---|---|
| 2,866,701 | 12/1958 | Strauss | 423/348 |
| 2,901,325 | 8/1959 | Theuerer | 423/348 |
| 3,442,622 | 5/1969 | Monnier et al. | 423/348 |
| 3,645,686 | 2/1972 | Tucker | 423/348 |
| 4,090,851 | 5/1978 | Berkman et al. | 156/DIG. 64 |
| 4,097,329 | 6/1978 | Stock et al. | 156/DIG. 64 |
| 4,097,584 | 6/1978 | Reuschel et al. | 423/348 |
| 4,312,700 | 1/1982 | Helmreich et al. | 156/DIG. 64 |

FOREIGN PATENT DOCUMENTS 922879   4/1963   United Kingdom ................ 423/348

Primary Examiner—Hiram H. Bernstein
Attorney, Agent, or Firm—Wood, Herron & Evans

[57] ABSTRACT

In the production of silicon articles at an elevated temperature, a stream comprising a controlled mixture of an oxygen-containing first gas and a second gas is admitted to the processing chamber. The first gas is one which partially dissociates under the conditions in the chamber to form both oxygen and the second gas. The second gas is one which is not harmful to silicon at the conditions in the chamber. Substantially equilibrium conditions are established in the chamber so that the dissociation of the first gas to oxygen occurs reversibly. The partial pressure of oxygen ($P_{O2}$) is sensed in the chamber during processing of the article. In response to the $P_{O2}$ level, the ratio of the rates of flow of the oxygen-containing gas and the second gas is adjusted so as to maintain the $P_{O2}$ at a level less than about $10^{-6}$ atmosphere, and usually no greater than about $10^{-10}$ atmosphere, at which the density of oxygen-related defects in the processed silicon article is acceptably low. Oxygen-related defects in the silicon are thereby reduced. If graphite structures are present in the hot zone of the processing chamber, they are preferably coated with an impervious coating which will stand the high temperature and will prevent the gas stream from coming into contact with the hot graphite. Carbon-related defects in the silicon are thereby also reduced.

9 Claims, 3 Drawing Figures

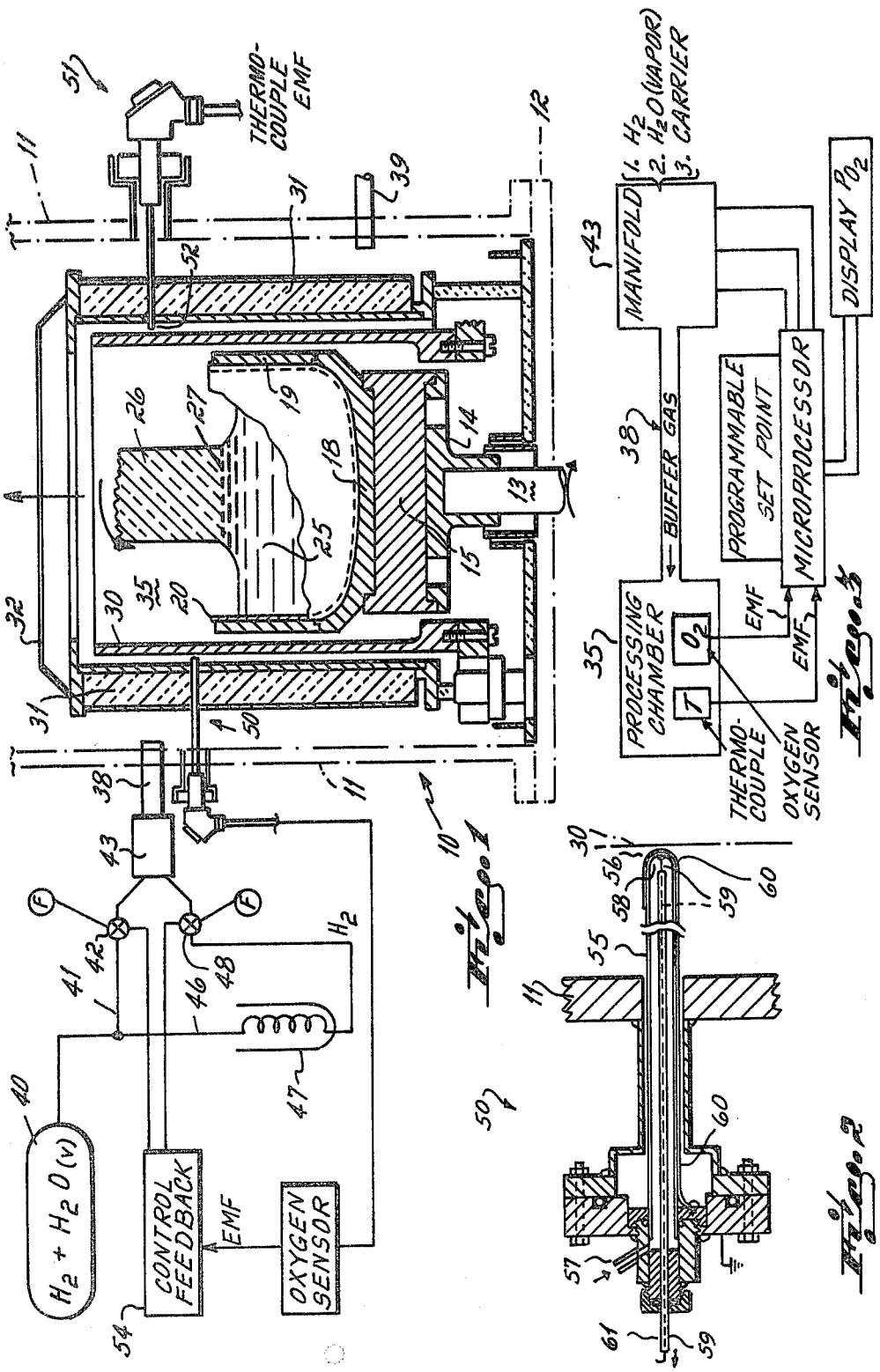

CONTROL OF OXYGEN- AND CARBON-RELATED CRYSTAL DEFECTS IN SILICON PROCESSING

FIELD OF THE INVENTION

This invention relates to a method for reducing and controlling the formation of oxygen- and carbon-related defects in silicon. The technique is useful in the production of elemental silicon from silicon-containing compounds, as well as in the growth or fabrication of single crystal or poly-crystalline silicon boules and devices.

BACKGROUND OF THE INVENTION

The production of silicon-based electronic devices requires silicon in which the density of defects in its crystal lattice structure is within low limits. Several different types of defects can be harmful. The presence of Group III or Group V electronically active impurities, such as aluminum, arsenic, boron, phosphorus, and the like can create so-called extrinsic point defects. Other types of defects, for example intrinsic point defects, line defects, stacking faults, and grain boundaries, can occur even in the absence of electronically active impurities, when the silicon is processed, even at mildly elevated temperatures. These latter types can be referred to as non-electronic impurity defects.

In contrast to the well understood extrinsic point defects, the causes of non-electronic impurity defects are not so clearly defined. Events leading to potential or actual crystal defects that would impair or ruin the properties of an electronic device made from silicon can occur at various stages, in the formation of the elemental silicon itself or later. For example, these defects can occur in the thermal decomposition or reduction of silicon-containing compounds. They can also occur in the production of single crystal silicon from molten silicon, for example in the Czochralski or float zoning techniques, and they can arise in the production of devices from previously formed elemental silicon, as in diffusion processes, expitaxial growth of monocrystalline silicon layers, ribbon forming processes, and in the silicon on ceramic process.

One group of crystal defects of the non-electronic impurity type are known as oxygen and carbon-related defects. Neither carbon nor oxygen is an electronically active impurity. Nevertheless, if the density of oxygen- and carbon-related crystal defects is too high in a given device, those defects can be a cause of improper or inadequate electronic performance.

Both oxygen and carbon are easily transported through the gas phase in the silicon processing environment, for example in the form of $CO_2$, $CO$, $SiO$ or $H_2O_{(v)}$. Because oxygen can also combine chemically with silicon to form solid $SiO_2$, it has generally been the practice to attempt to exclude it from the chamber in which silicon is processed. Thus the common procedure has been either to evacuate the chamber or to blanket the chamber under an inert gas, such as argon or helium. However, such procedures nevertheless leave significant amounts of oxygen in the processing environment. The residual oxygen content may be many orders of magnitude greater than the extremely low values required to prevent oxygen from reacting with silicon. For example, at 1700° K., at which silicon is a liquid, the oxygen partial pressure in an evacuated or inert gas filled silicon processing chamber may be only $10^{-6}$ atm but oxygen related defects can still occur. In fact, silicon can be undesirably oxidized at any oxygen partial pressure above the equibrium pressure for oxygen-silicon reactions by which silicon oxides are formed; at 1700° K. this pressure is about $10^{-18}$ atm. The presence of carbon dissolved in, or in the environment of, molten silicon, reduces the oxygen partial pressure by reaction with the oxygen and therefore increases the amount of oxygen which can be tolerated in the ambient gas without detrimental oxygen-related defects being formed upon solidification of the silicon. At the same time, the carbon content of the molten silicon may be lowered, reducing the potential for carbon-related defects in the solid crystal.

Large proportions of carbon are often present in the chamber. Heaters, crucibles, and other structures in the processing environment are often made of graphite because of its useful high temperature properties. The reactions between carbon and oxygen provide products which transport carbon as well as oxygen through the vapor phase to the silicon surface and from there into the body by diffusion.

BRIEF DESCRIPTION OF THE INVENTION

It has been the objective of this invention to provide a process for carefully controlling the presence of oxygen- and/or carbon-related defects in the production of silicon bodies.

It has been discovered that both oxygen- and carbon-related defects can be controlled and reduced through deliberate addition of an $O_2$-containing buffering gas atmosphere to the silicon processing chamber. This atmosphere is established by admtting to the chamber a gas mixture comprising at least two gases: a first gas which at the conditions present in the chamber dissociates in equilibrium to form both $O_2$ as well as the second gas of the mixture. The second gas is one which does not react detrimentally with the silicon at the processing conditions. The oxygen partial pressure in the chamber atmosphere is measured, and the rates of flow of one or more of the components of the gas mixture are adjusted to establish and maintain the oxygen partial pressure in the processing chamber at a low defect-producing level, which is less than about $10^{-6}$, and which usually will be in the approximate range of $10^{-10}$ to $10^{-22}$ atmosphere.

Hydrogen and water vapor comprise a suitable inlet gas system for this purpose. Under the elevated temperature conditions in the processing chamber, the water vapor reversibly decomposes to form oxygen and hydrogen, which is the other gas of the inflowing mixture. Another useful buffer gas system is the system carbon dioxide and carbon monoxide. In the processing chamber the $CO_2$ reversibly decomposes to form the other admitted gas component (CO), and oxygen. The CO does not adversely affect the silicon at the processing conditions, as long as the $P_{O_2}$ is sufficiently high to prevent the decomposition of CO.

In carrying out this method the buffer gases are to be admitted into the silicon processing chamber at a controllable flow rate and ratio. To provide controllable flow rates, the inlet gases may be mixed with a dry inert carrier gas, for example argon. By controlling the flow ratios of the admitted gases, the partial pressure of oxygen ($P_{O_2}$) in the chamber can be controlled. It has been found that if $P_{O_2}$ is controlled at a very low level, preferably in the range of $10^{-12}$ to $10^{-18}$ atmosphere, the density of oxygen-related defects in the silicon being processed is also controlled.

Moreover, if carbon (i.e., graphite) surfaces in the chamber are coated with a vapor impervious layer such as silicon carbide, control of $P_{O_2}$ enables the density of carbon-related defects to be controlled, as well.

A particularly useful sensor for generating a voltage signal that varies with $P_{O_2}$ level in the silicon processing chamber utilizes a thoria-yttria solid state electrolyte. The outside of a tube made of a dense thoria-yttria ceramic solid solution is exposed to the $O_2$-containing atmosphere in the processing chamber, and the inside is exposed to a known $O_2$-containing reference gas mixture. The tube wall acts as a solid state electrolyte and develops a voltage across it that reflects differences in the $P_{O_2}$ levels on its inner and outer surfaces. The output voltage can be calibrated to reflect the chamber $P_{O_2}$ pressure directly and can be used to regulate the flow of gases into the chamber, thereby to control $P_{O_2}$ at a preset value. However, it will be understood that the invention does not require use of any particular device for measuring the oxygen partial pressure.

In a preferred embodiment of the invention the $P_{O_2}$-sensor signal is applied to regulate the flow into the chamber of one or the other, and preferably both, of the gases of the admitted stream, and thereby to alter the ratio of their flow rates, preferably to maintain a substantially constant total flow rate through the processing chamber.

The invention can best be further described and explained by reference to the accompanying drawings, in which:

FIG. 1 is a diagrammatic illustration, partly in axial section, of a Czochralski furnace, which has been provided with apparatus for carrying out the method of the invention;

FIG. 2 is an enlarged view of a preferred form of solid electrolyte tube sensor, useful to measure the oxygen partial pressure in a silicon processing chamber; and FIG. 3 is a block diagram of a circuit for controlling $P_{O_2}$ in response to a sensed indication of $P_{O_2}$ and processing chamber temperature.

As indicated, the present process is useful to control oxygen- and/or carbon-related defects in a wide variety of processes wherein silicon is treated at an elevated temperature in a graphite or carbon-containing environment. For purposes of illustration but not limitation, the invention is described hereinafter primarily in relation to a process wherein a single crystal of silicon is being pulled from a melt in a Czochralski furnace.

Apart from the oxygen partial pressure measuring and controlling apparatus, the furnace or other silicon processing chamber of itself may be of known design. The furnace designated generally by 10 in FIG. 1 includes a housing or enclosure having sidewalls 11 shown by dashed lines partly broken away at the top, and a base 12. A drive shaft 13 supports a rotatable pedestal 14, which in turn carries a pedestal insulator 15. In the apparatus shown, a two-part crucible support is provided, comprising a lower crucible support 18, to which a cylindrical upper crucible support 19 is joined. A crucible 20 is seated within and supported by crucible supports 18, 19. This crucible 20 is preferably made of graphite and is coated with silicon carbide, as hereinafter disclosed, as are all heated graphite components of the furnace.

In operation the crucible 20 contains a melt of elemental silicon 25, from which a crystalline silicon body or boule 26 is slowly drawn. A liquid/solid interface 27 is established between the molten silicon 25 and the solid silicon body 26, as the latter is pulled from the melt. The body 26 is rotated, usually in the opposite direction from shaft 13, and is pulled upwardly by a drive which is not illustrated, which can be of known type.

The silicon melt 25 within the crucible is maintained in molten condition by a heater 30 which may be a continuous or slotted graphite cylinder that concentrically surrounds the crucible support and crucible. A heat shield or insulating assembly 31 surrounds heater 30. An open topped cone shield 32 is disposed above the heater. For crystal pulling, the furnace is heated to a temperature above the melting point of silicon, for example 1450° C. The heated space within the entire vessel, bounded by sidewalls 11, base 12, and the chamber lid, is referred to as the silicon processing chamber 35.

The heating and heated elements of the furnace may be made of graphite. These may include the heater 30, crucible 20, crucible holder 18, 19, heat shield 31, and the various accompanying structural support members. They should be coated with a vapor-impervious layer of silicon carbide. A preferred technique for depositing the silicon carbide layer or graphite is by chemical vapor deposition, a well known art.

Silicon processing chamber 35 is blanketed by a flowing gas stream that is admitted through furnace enclosure 11 by an inlet line 38. A slight positive pressure is maintained in the furnace, and the gas flows out through an exit line 39. The gas input stream comprises a mixture of two gases, one of which is reversibly thermally decomposable under the conditions in the chamber 35 to form $O_2$ and the other gas. Optionally, an inert carrier gas may also be present. The gases are fed from separately controllable sources. In the preferred embodiment illustrated, the inlet gas is a controlled mixture of hydrogen and water vapor. These may be supplied separately. However, a typical tank source 40 of hydrogen as supplied inherently will include an appreciable amount of water vapor in it; a separately controllable source of relatively $H_2O$-free $H_2$ can be mixed with the gas supplied by the tank 40 to obtain the desired $H_2/H_2O$ mixture. The $H_2/H_2O$ mixture flows through a line 41 having a flow regulating valve 42 with a flow indicator F, to a manifold or gas mixing chamber 43, from which gas inlet line 38 extends into furnace 10.

Part of the flow from tank 40 may be taken off through a line 46 to a cryogenically cooled water trap 47, by which the water vapor in the gas is at least partially frozen and thereby is removed. This reduces the $P_{H_2O}$ in line 46, which then passes through a flow regulating valve 48 to manifold 43, wherein it mixes with the $H_2$ with a higher water vapor content from line 41. It can be seen that by adjusting the rates of flow at valve 42 and/or 48, the $H_2/H_2O$ ratio of the gas entering chamber 35 can be varied and controlled.

The temperature within chamber 35 is sensed by a thermocouple 51, which may be conventional. The thermocouple probe 52 measures the temperature at an accessible point in chamber 35. The temperature which is of greatest interest is that of the melt surface, and this can be calibrated from the temperature at the probe. The silicon temperature is used in the $P_{O_2}$ calculation, either by a microprocessor or manually, as shown below in equations (3) and (4).

Means are designated generally at 50 for sensing the partial pressure of oxygen in the furnace. Like thermocouple 51, the $P_{O_2}$ sensor 50 extends a convenient distance into the chamber. The calibration with respect to the temperature difference is used in the calculation, as with the thermocouple.

A preferred form of $P_{O_2}$ sensor 50 is shown in greater detail in FIG. 2. It includes a tube 55, closed at one end 56, comprising a sintered ceramic solid solution of 93% thoria ($ThO_2$) and 7% yttria ($Y_2O_3$). The outside of closed end 56 of tube 50 is exposed to the gas atmosphere of the processing chamber 35; a reference gas to be described is admitted axially through the interior of tube 55, via a reference gas inlet line 57, to flow across the inside surface 58 at tube end 56, to an outlet 61. Electric leads 59, 60 reflect the potential difference between the inside and outside surfaces of tube 55. The reference gas comprises a known $O_2$-containing mixture of the components of chamber gas, and is circulated through the inside of tube 55. Thus the furnace buffer gas mixture on the outside of the tube and the reference gas on the inside of the tube flow on opposite surfaces of tube 55. The tube acts as an electrolyte in the presence of these two different gases and a galvanic output is produced across its inside and outside surfaces which, together with the gas temperature, can be used to determine the partial pressure of the oxygen in the chamber atmosphere. A linear relationship exists between log

and the galvanic EMF output, so that sensor output can be calibrated to read the chamber $P_{O_2}$ directly. The measurement of $P_{O_2}$ by a thoria-yttria sensor is known per se, see for example Physics of Electrolytes, edited by J. Hladik, Academic Press 1972, Vol. 2, article by K. S. Goto & W. Pluschkell, at pp 539–622; and Z. Phys. Chem., Vol. 49, article by M. F. Lasker and R. A. Rapp, at pp 198–221, and does not comprise the invention.

Once the level of $P_{O_2}$ within the furnace chamber 35 is sensed, that pressure can be controlled at a desired level by control of the rates of flow of the inlet gas components through valves 42 and/or 48.

At equilibrium under the conditions in the processing chamber, the oxygen-containing gas of the inlet buffer gas reversibly dissociates to form oxygen and the second gas of the mixture:

$$2H_2O_{(v)} \rightleftharpoons 2H_2 + O_2 \qquad (1)$$

or, in the $CO_2/CO$ system, $$2CO_2 \rightleftharpoons 2CO + O_2 \qquad (2)$$

At equilibrium the relation between the partial pressures of the buffer gas components is:

$$P_{O_2} = \left(\frac{P_{H_2O}}{P_{H_2}}\right)^2 \exp\frac{\Delta G}{RT} \qquad (3)$$

where G is the free energy associated with the decomposition of the $H_2O_{(v)}$ as shown in equation (1), R is the gas constant and T is the absolute temperature. The proportion of oxygen in the processing chamber varies with the law of mass action and it can be seen that by controlling the ratio between two of the components of the buffer gas, $P_{O_2}$ can thereby be controlled. By way of illustration, if $P_{O_2}$ is too high, it can be reduced by decreasing the flow rate (i.e., by closing valve 42) and hence the quantity of water vapor and/or by increasing the flow rate and hence quantity of hydrogen (i.e., by opening valve 48). Or if $P_{O_2}$ is lower than desired, it can be increased by decreasing $H_2$ flow rate (by closing valve 48) and so on. Desirably, the total flow rate through the chamber is maintained substantially constant by opposite changes in the flow rates through valves 42 and 48.

In the $CO_2/CO$ system, a lower $P_{O_2}$ operating limit arises where the CO begins to decompose. Where that occurs a carbon-CO equilibrium would be established and the $P_{O_2}$ would be controlled by it, and control of the $P_{O_2}$ by adjusting gas flow rates would be lost. That limit can be determined for a given system, using known techniques.

Valves 42 and 48 can be actuated automatically in response to the potential (EMF) signal derived from the sensor 50. FIGS. 1 and 3 illustrate a control system in block diagram form whereby the signal operates a feedback control indicated generally at 54. A simplified program for controlling the ratios of the flows can be stated as follows:

1. Read chamber temperature thermocouple 51 and $P_{O_2}$ sensor 50.
2. Calculate $P_{O_2}$ from the Nernst equation

$$EMF = \frac{RT}{4F} \ln \frac{P_{O_2} \text{ chamber}}{P_{O_2} \text{ reference}} \qquad (4)$$

3. Is $P_{O_2}$ equal to desired value ("set point")?
4. If yes, hold valve position.
5. If no, go to valve positioning algorithm.

Suitable apparatus and algorithm for adjusting valves are known in the art and do not comprise the invention.

Control of $P_{O_2}$ provides control of oxygen-related defects in the silicon being processed. The density of oxygen-related defects and/or carbon-related defects in the silicon of the processed article can be analyzed by known techniques. (This determination can also be made, though on a less accurate basis, by visual observation of polycrystalline silicon during growth.) If at given processing conditions the silicon contains an undesirably high density of oxygen-related defects, then the $P_{O_2}$ at equilibrium processing conditions is reduced. This in turn leads to reduction of the oxygen-related defect density. The $P_{O_2}$ is reduced until an acceptable defect density is reached.

Moreover, the control of the oxygen-related defects, together with minimization of heated carbon surfaces as by coating them, provides control of carbon-related defects as well. If the proportion of carbon-related defects in the silicon is too great, they can be reduced by coating the graphite surfaces or by increasing the $P_{O_2}$ in order to increase the rate of combination of the carbon with oxygen, and thereby will remove the carbon from the system.

Having described the invention, what is claimed is:

1. In a process of producing a solid state silicon device wherein a silicon body is exposed in a processing chamber to elevated temperatures as a step in the production of said device, a method for reducing the formation of oxygen- and carbon-related defects in the silicon body, comprising, placing the silicon body in said processing chamber and heating the body to said elevated temperatures, admitting to said chamber a stream of an oxygen-containing first gas which will dissociate to form oxygen and a second gas which is inactive with respect to the silicon body in the chamber, also admitting a stream of said second gas to said chamber, the two gases comprising a buffer gas mixture in the chamber, establishing substantially equilibrium conditions of temperature and pressure in said chamber and partially dissociating said first gas at such conditions to form oxygen therein, sensing the partial pressure of oxygen in the chamber, providing and maintaining a ratio between the rates of flow of the first and second gases in response to said sensing, which ratio establishes an oxygen partial pressure in said chamber that is no greater than about $10^{-6}$ atmosphere and at which the density of oxygen-related defects in said device is acceptably low, and cooling the body and removing it from the chamber.

2. The method of claim 1 wherein said chamber contains structure made of graphite, and including the further step of coating said structure with a layer of material which prevents contact of the graphite with the gases in the chamber, thereby reducing carbon-related defects in the silicon.

3. The method of claim 2 wherein substantially all the graphite structures within said chamber are coated with silicon carbide.

4. The method of claim 1 wherein the oxygen partial pressure established in said chamber is within the range of $10^{-12}$ to $10^{-22}$ atmosphere.

5. The method of claim 1 wherein said first gas is $H_2O_{(v)}$ and said second gas is $H_2$.

6. The method of claim 1 wherein said first gas is $CO_2$ and the second gas is CO.

7. The method of claim 1 wherein said device is a single crystal or a poly-crystalline silicon body and is produced by growing from a melt of elemental silicon in said processing chamber under the conditions described.

8. The method of claim 1 wherein the rates of flow into said chamber of the two gases are adjusted oppositely to one another as the sensed partial pressure changes, thereby to maintain a substantially constant total flow rate into said chamber.

9. The method of claim 1 wherein said body during the entire time it is at said elevated temperatures is in said chamber, in the presence of the first and second gases at said partial pressure.

* * * * *